(12) United States Patent
Singh et al.

(10) Patent No.: US 6,459,482 B1
(45) Date of Patent: Oct. 1, 2002

(54) GRAINLESS MATERIAL FOR CALIBRATION SAMPLE

(75) Inventors: Bhanwar Singh, Morgan Hill, CA (US); Ramkumar Subramanian, San Jose, CA (US); Khoi A. Phan, San Jose, CA (US); Bharath Rangarajan, Santa Clara, CA (US); Michael K. Templeton, Atherton, CA (US); Sanjay K. Yedur, San Ramon, CA (US); Bryan K. Choo, Mountian View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/729,294

(22) Filed: Dec. 4, 2000

Related U.S. Application Data

(60) Provisional application No. 60/242,804, filed on Oct. 24, 2000.

(51) Int. Cl.⁷ .................................................. G01J 1/10
(52) U.S. Cl. ................................ 356/243.1; 250/252.1
(58) Field of Search ............................ 356/243.1, 243.7, 356/394, 237.4, 237.5, 237.1, 600, 630, 635, 636, 639, 640; 250/252.1, 306, 310; 257/48; 438/398, 239, 396

(56) References Cited

U.S. PATENT DOCUMENTS 5,625,170 A * 4/1997 Poris .......................... 73/1.13
5,920,067 A * 7/1999 Cresswell et al. ........... 250/306
5,989,969 A   11/1999 Watanabe et al. ........... 438/381
6,016,684 A *  1/2000 Scheer et al. ............. 250/252.1
6,048,743 A    4/2000 Yang et al. .................... 438/14
6,214,689 B1 * 4/2001 Lim et al. .................... 438/398
6,310,688 B1 * 10/2001 Kao et al. .................... 356/600

* cited by examiner

Primary Examiner—Frank G. Font
Assistant Examiner—Sang H. Nguyen
(74) Attorney, Agent, or Firm—Amin & Turocy, LLP

(57) ABSTRACT

The present invention provides SEM systems, SEM calibration standards, and SEM calibration methods that improved accuracy in critical dimension measurements. The calibration standards have features formed with an amorphous material such as amorphous silicon. Amorphous materials lack the crystal grain structure of materials such as polysilicon and are capable of providing sharper edged features and higher accuracy patterns than grained materials. The amorphous material can be bound to a silicon wafer substrate through an intermediate layer of material, such as silicon dioxide. Where the intermediate layer is insulating material, as is silicon dioxide, the intermediate layer may be patterned with gaps to provide for electrical communication between the amorphous silicon and the silicon wafer. Charges imparted to the amorphous silicon during electron beam scanning may thereby drain to the silicon wafer rather than accumulating to a level where they would distort the electron beam.

22 Claims, 3 Drawing Sheets

GRAINLESS MATERIAL FOR CALIBRATION SAMPLE

RELATED APPLICATIONS

This application claims priorty under 35 U.S.C. §119 provisional application Ser. No. 60/242,804 filed Oct. 24, 2000, which is hereby incorporated by reference.

TECHNICAL FIELD

The present invention relates to nanometerology and in particular to calibration methods, calibration standards, and systems critical dimension scanning electron microscopy.

BACKGROUND OF THE INVENTION

In the semiconductor industry, there is a continuing trend toward higher device densities. To achieve these higher device densities there have been, and continue to be, efforts toward scaling down the device dimensions on semiconductor wafers. In order to accomplish higher device densities, smaller and smaller features sizes are required. These may include the width and spacing of interconnecting lines, spacing and diameter of contact holes, and surface geometry of corners and edges of various features.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as optical light, x-rays, or an electron beam) through an intervening master template, the mask, forming a particular pattern. Exposed areas of the coating become either more or less soluble than the unexposed areas (depending on the type of coating) in a particular solvent developer. The more soluble areas are removed with the developer in a developing step. The less soluble areas remain on the silicon wafer forming a patterned coating. The pattern corresponds to the image of the mask or its negative. The patterned resist is used in further processing of the silicon wafer.

At various stages in forming the patterned resist coating and processing the silicon wafer, it is desirable to measure critical dimensions resulting from the lithographic process. Critical dimensions include the size of features in the wafer or patterned resist such as line widths, line spacing, and contact dimensions. Due to the extremely fine patterns involved, scanning electron microscopy (SEM) is often employed to analyze critical dimensions. Specialized critical dimension measuring SEM systems have been developed for use with silicon wafers, which are of a size that makes them too large for most SEM systems.

In SEM, an electron beam is scanned across the sample. The beam interacts with the sample to produce measurable responses that vary with position over the course of a scan. Measurable responses include backscattering of electrons and production of secondary electrons, auger electrons, X-rays and cathodoluminescence. Secondary electrons are the most useful of the measurable responses in accessing surface topography and are the responses most often employed in critical dimension analysis.

Although SEM systems measure critical dimensions with high precision, they must be calibrated frequently for the measurements to be accurate. Precision refers to the capability of distinguishing small differences in dimension. Accuracy refers to the correctness of measurements in absolute terms. Precise measurements are reproducible, but contain systematic errors that must be quantified and taken into account for the measurements to be accurate. Calibration quantifies systematic errors and is carried out on a regular basis in SEM systems, usually at least once a day.

Calibration involves taking measurements on a calibration standard. A calibration standard is a sample having accurately known dimensions. One calibration standard commonly employed is a periodic pattern formed into a silicon substrate. Such a calibration sample is simple, but has low contrast and easily becomes contaminated over the course of extended use.

Another type of calibration standard is formed with a patterned polysilicon coating over a silicon wafer. A thin layer of silicon oxide is used to facilitate binding between the patterned polysilicon and the wafer. A similar calibration standard is formed with a uniform polysilicon coating over the silicon oxide layer and has a calibration patterned formed in another silicon oxide coating that is formed over the polysilicon. These calibration standards can be used with very low electron beam energies, howvere, due to the insulating properties of the silicon oxide, at higher beam energies these calibration standards undesirably accumulate charges that affect the electron beam and skew calibration measurements.

Another calibration standard, described in Yang et al., U.S. Pat. No. 6,048,743, includes a semiconductor wafer, an insulating first patterned layer formed on the wafer, a plurality of contacts electrically communicating with the wafer and formed between the pattern of the first insulating layer, a conductive layer formed over the first insulating layer and in electrical communication with the wafer through the contacts, and a second insulating layer with a second pattern formed over the conductive layer. The conductive layer electrically communicates between the second insulating layer and the wafer and permits charges to drain from the second insulating layer to the wafer during scanning. An example is provided in which the second insulating layer is polysilicon. The accuracy of this calibration standard is limited by the roughness of the edges of features formed by the patterned polysilicon layer and is not commensurate with the resolving power of some electron microscopes.

Despite the availability of SEM system calibration standards, there remains an unsatisfied need for SEM system calibration standards and calibration methods with improved accuracy.

SUMMARY OF THE INVENTION

The present invention provides SEM systems, SEM calibration standards, and SEM calibration methods that improve accuracy in critical dimension measurements. The calibration standards have features formed with an amorphous material including amorphous silicon. These feature have smooth side walls and provide a calibration standard with desirable such as sharp edges, high contrast, well characterized spacial dimensions, low cost, and high durability.

One aspect of the invention provides a calibration standard for an SEM system including a silicon wafer and a patterned coating containing amorphous silicon, wherein the patterned coating is over the silicon wafer and the patterned coating is in electrical communication with the silicon wafer.

Another aspect of the invention provides a calibration standard for an SEM system including a silicon wafer, a conductive layer over the silicon wafer, and a patterned coating containing amorphous silicon, wherein the patterned coating is over the conductive layer and the patterned coating is in electrical communication with the conductive layer.

A further aspect of the invention provides a calibration standard for an SEM system including means for providing sub-micron amorphous silicon features having smooth surfaces and means for grounding the amorphous silicon features during the calibration scanning.

A further aspect of the invention provides a package including contents including a silicon wafer and a patterned coating over the silicon wafer containing amorphous silicon, and instructions for using the contents as a calibration standard for an SEM system.

A further aspect of the invention provides a method of calibrating an SEM system including obtaining a calibration measurement by employing the SEM system to measure a dimension of a feature of a calibration standard including a patterned coating containing amorphous silicon and using the calibration measurement to calibrate the SEM system.

A further aspect of the invention provides an SEM system including a scanning electron microscope and a calibration standard including a pattern formed of an amorphous material containing amorphous silicon, wherein the SEM system is configured to employ the calibration standard in calibrating the scanning electron microscope.

DETAILED DESCRIPTION OF THE INVENTION

Figure 1:
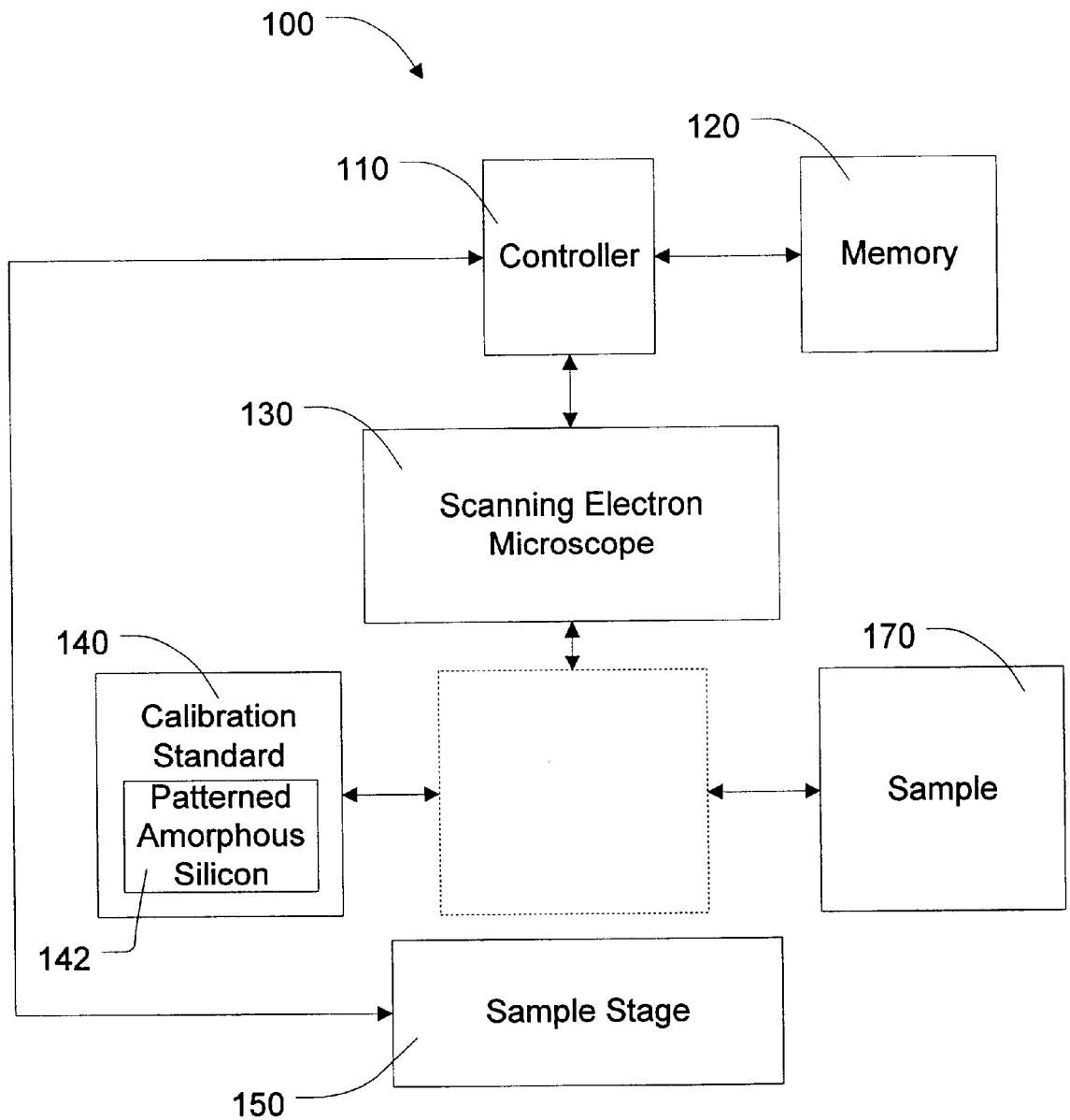
FIG. 1 is a high level schematic of an SEM system according to one aspect of the present invention.

FIG. 1 is a high level schematic illustration of an SEM system 100 according to one aspect of the present invention. SEM system 100 includes scanning electron microscope 130, sample stage 150, calibration standard 140, controller 110, and memory 120. SEM system 100 is calibrated by placing calibration standard 140 on sample stage 150 and scanning calibration standard 140 with scanning electron microscope 130. Controller 110 stores the calibration data in memory 120 and uses the data to interpret data obtained by scanning sample 170 of which an accurate measurement is sought.

Calibration standard 140 includes a pattern suitable for use in calibrating an SEM. A suitable pattern may include features, such as raised lines, trenches, or holes, of fixed width or spacing. The pattern may include periodic or non periodic features. For example, the pattern may include a series of raised lines with fixed pitch, or series of lines with predetermined but varying spacing. In one aspect of the invention, the calibration standard has periodic features with a pitch less than about 1 micron. In another aspect of the invention, the calibration standard has periodic features with a pitch less than about 200 nm. In a further aspect of the invention, the calibration standard has periodic features with a pitch less than about 50 nm.

The pattern is formed of an amorphous material that includes amorphous silicon. Amorphous silicon is a non-crystalline form of silicon that lack the crystal grain structure of materials such as polysilicon and is capable of providing smoother edges, sharper features, and higher accuracy patterns than grained materials. $R_{tm}$, a measure of surface roughness, is the mean of the maximum peak-to-valley vertical measurement from each of five consecutive sampling measurements, and can be measured using known techniques including using one of an atomic force microscope and a scanning electron microscope. A rough surface is characterized by "mountainous" features (numerous peaks and valleys) and/or dendritic features. In one aspect of the invention, the amorphous material provides features having an $R_{tm}$ of about 20 Å or less. In another aspect of the invention, the amorphous material provides features having an $R_{tm}$ of about 10 Å less. In a further aspect of the invention, the amorphous material provides features having an $R_{tm}$ of about 5 Å or less.

Generally, the amorphous material is patterned over a substrate. The substrate may be of any type, conductor, semi-conductor, or insulator, but is generally either a semi-conductor or conductor that may be grounded to sample stage 140. The substrate may be of any shape that fits within a sample chamber of electron microscope 130. For example, the substrate maybe a silicon wafer that conveniently fits in the sample holder of a CD-SEM adapted for use in measuring critical dimensions on silicon wafers.

The amorphous material can be bound to a silicon wafer substrate through an intermediate layer of material, such as silicon dioxide. Where the intermediate layer contains an insulating material, such as silicon dioxide, the intermediate layer may be patterned with gaps to provide for electrical communication between the amorphous silicon and the silicon wafer. Electrostatic charges imparted to the amorphous silicon during electron beam scanning may thereby drain to the silicon wafer rather than accumulating to a level where they may distort the electron beam.

A coating composed primarily or entirely of amorphous silicon may be conveniently formed by chemical vapor deposition (CVD), especially low pressure CVD (LPCVD). The source gas may contain silane, for example. Suitable temperatures for forming an amorphous silicon layer by CVD are, for example, from about 450° C. to about 600° C. from about 500° C. to about 550° C. and from about 510° C. to about 525° C. Suitable pressures for forming an amorphous silicon layer by CVD are, for example, from about 0.0001 Torr to about 100 Torr, from about 0.01 Torr to about 10 Torr, and from about 0.1 Torr to about 1 Torr. The source gas may be diluted with an inert gas, such as helium, for example, such that the source gas contains from about 10% to about 99%, or from about 20% to about 50%, inert gas.

In one aspect of the invention, the thickness of the coating of amorphous material is from about 1 nm to about 1000 nm. In another aspect of the invention, the thickness of the coating of amorphous material is from about 5 nm to about 200 nm. In a further aspect of the invention, the thickness of the coating of amorphous material is from about 10 nm to about 50 nm.

After the coating is deposited, cooling in an atmosphere of hydrogen, 10 Torr for example, prevents the coating from forming crystals. Conditions under which the amorphous silicon anneals to form crystals, such as vacuum conditions and high temperatures, are avoided. Dopants, such as phosphorous or arsenic in a concentration of, for example, from about $1 \times 10^{20}$ atoms/cm$^3$ to about $1 \times 10^{21}$ atoms/cm$^3$, are beneficial in that they tend to prevent silicon crystal formation.

The coating of amorphous material may be patterned using lithography. For example, a resist delineating the desired pattern may be formed over an amorphous silicon coating and the coating dry etched. Depending on the process used to form the pattern, further processing may improve the uniformity of the pattern feature edges. In particular, a thin layer of amorphous silicon may be deposited on the pattern coating. Any oxide film that forms over the amorphous silicon during patterning may be removed by immersion for 30 seconds in an aqueous solution of HF/H2O in a ratio of 1/30 . Deposition of the thin amorphous silicon film is then carried out at low pressure. Where an amorphous silicon coating is formed over a silicon oxide coating, pressures below about 0.001 Torr have the advantage of giving deposition that is highly selective in preference of deposition on amorphous silicon over deposition on silicon oxide.

When forming a patterned coating of amorphous silicon over a silicon wafer, an intermediate layer that promotes binding of the amorphous silicon to the silicon wafer is desirable. The intermediate layer may include silicon dioxide, for example. A silicon dioxide layer may be formed over a silicon wafer by thermal oxidation treatment or by deposition techniques. In one aspect of the invention, the intermediate layer has a thickness from about 10 nm to about 1000 nm. In another aspect of the invention, the intermediate layer has a thickness from about 25 nm to about 300 nm.

In a further aspect of the invention, the intermediate layer has a thickness from about 50 nm to about 100 nm.

Where an intermediate layer is included and the intermediate layer is an insulating material, it is desirable to make provisions to prevent accumulation of electrostatic charges on the patterned coating of amorphous material. In one aspect of the invention, therefore, the intermediate layer is patterned to provide for electrical communication between the patterned coating of amorphous material and the substrate.

Figure 2:
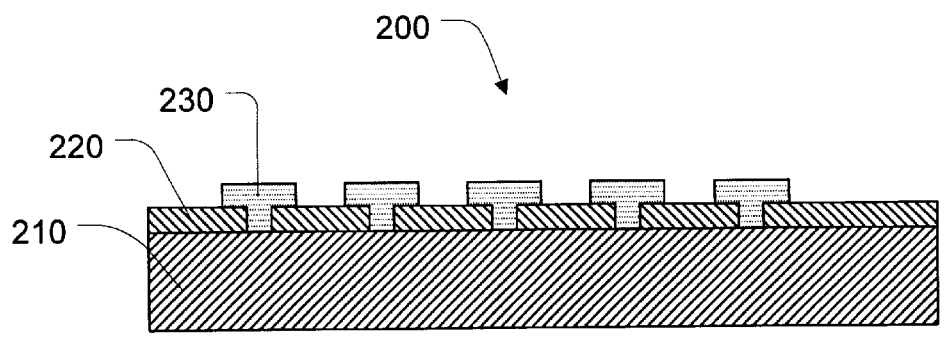
FIG. 2 is a cross-sectional schematic illustration of a calibration standard according to another aspect of the present invention.

FIG. 2 provides a cross-sectional illustration of such a calibration standard. Calibration standard 200 has trenches formed in intermediate layer 220 that provide for electrical communication between patterned amorphous material coating 230 and substrate 210. The electrical communication takes place along the lengths of patterned lines in patterned amorphous material coating 230. Substrate 210 is conducting or semiconducting and carries away charges from patterned amorphous material coating 230 during scanning. Substrate 210 is typically grounded to the sample stage during SEM system operation.

Figure 3:
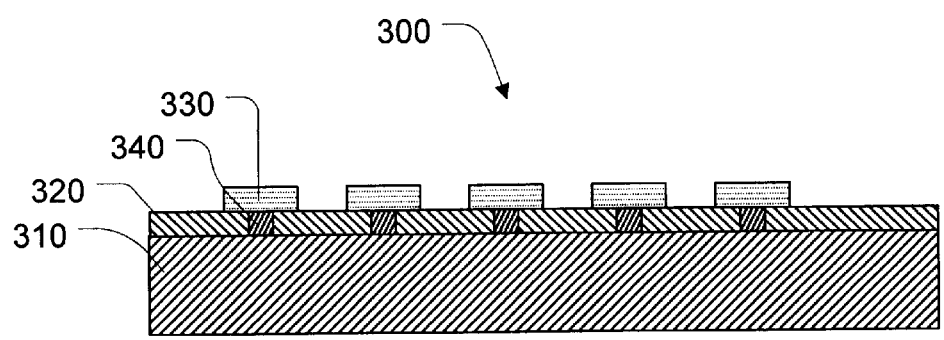
FIG. 3 is a cross-sectional schematic illustration of another calibration standard according to a further aspect of the present invention.
Figure 4:
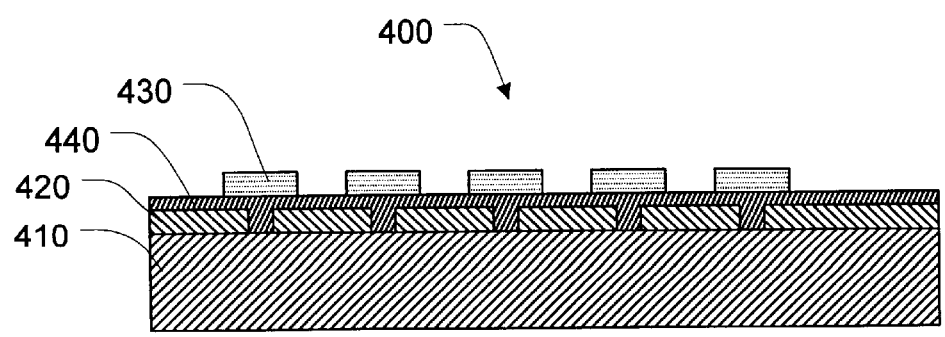
FIG. 4 is a cross-sectional schematic illustration of another calibration standard according to a further aspect of the present invention.
Figure 5:
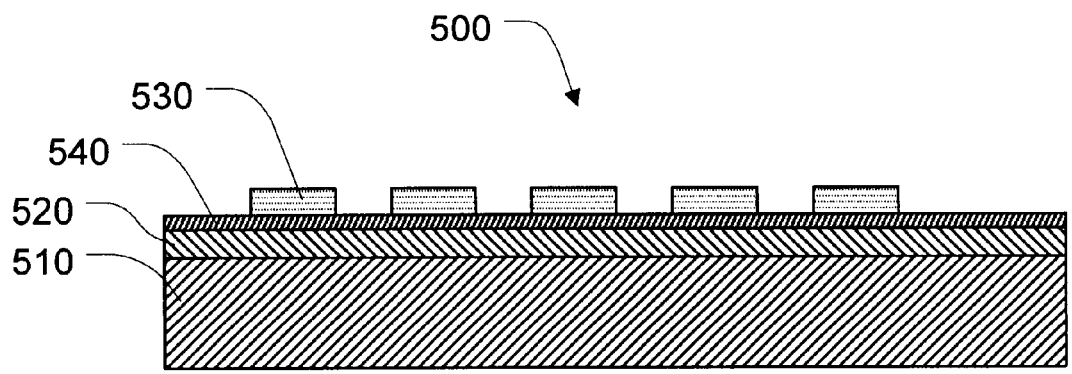
FIG. 5 is a cross-sectional schematic illustration of another calibration standard according to a further aspect of the present invention.

The patterned amorphous material coating of calibration standard 200 directly contacts the substrate, however, electrical communication may be established without direct contact. FIG. 3 provides a cross-sectional illustration of a calibration standard 300 having patterned amorphous material coating 330 in electrical communication with substrate 310 through conductive material 340 that fills gaps in intermediate layer 320. The conductive material may include, for example, a metal such as gold, tungsten, aluminum, silver, or copper, or a conductive metal oxide such as titanium oxide or tin oxide.

Where the amorphous material binds well to the conductive material the conductive material may form a continuous layer over the intermediate layer. This configuration is illustrated by FIG. 4, which provides a cross-sectional illustration of a calibration standard 400 having patterned amorphous material coating 430 in electrical communication with substrate 410 through a continuous layer of conductive material 440 that contacts substrate 410 through gaps patterned in intermediate layer 420. Charged drain from patterned amorphous material coating 430 to substrate 410 through conductive layer 420.

Where conductive material forms a continuous layer over the substrate, grounding may take place though the conductive layer rather than through the substrate. FIG. 5 provides a cross-sectional illustration of a calibration standard 500 having patterned amorphous material coating 530 over conductive material 540 over intermediate layer 520 over substrate 510. During SEM scanning, conductive layer 540 may be grounded to the sample stage, whereby charges drain from patterned amorphous material coating 530 through conductive layer 540.

Returning to FIG. 1, the calibration standard 140 is used in system 100 with scanning electron microscope 130. Scanning electron microscope 130 may detect backscattered electrons, interference of backscattered electrons, secondary electrons, auger electrons, X-rays or cathodoluminescence. In operation of system 100, an electron beam is scanned across calibration standard 140 or sample 170 and a response that varies with position over the course of a scan is measured. Scanning is generally effectuated by varying the angle of the electron beam, although scanning may also be effectuated by moving sample stage 150. In either case, calibration provides a relationship between the measured relative movement of the electron beam and the sample and their actual relative movement. Calibration may also be used to take into account such factors as the effect of electron beam cross-sectional dimensions in measuring sample critical dimensions.

Scanning, calibration, or both may take place under the direction of controller 110. Controller 110 receives data from scanning electron microscope 130 and, in some cases, sample stage 150. Where the data includes measurements from sample 170, controller 110 may transmit the data, store the data in memory 120, and/or interpret the data in view of calibration measurements. Where the data concerns calibration standard 140, controller 110 may transmit the data, store the data in memory 120, and/or interpret the data to calibrate scanning electron microscope 130.

Controller 110 typically includes a microprocessor, but may be any device that is capable of applying calibration data to scale or interpret measurements from the nano-scale measuring device 130. Controller 110 maybe analog or digital. If controller 110 is digital, its instructions may be implemented in either hardware or software.

Controller 110 may be configured to calibrate scanning electron microscope 130 in response to an instruction, which may be provided by a user or may be generated automatically based on the passage of time, whether the system has recently been powered on, or any other circumstance that may indicate the need for calibration.

As part of the calibration, controller 110 may accept as an input dimensional data regarding features of calibration standard 140. The calibration process involves scanning calibration standard 140 and storing or interpreting the calibration data for application to measurements of sample 170. The scan, or sequence of scans, of the calibration standard my be directed by controller 110 as part of the calibration process.

Controller 110 may also direct the loading of calibration standard 140 onto sample stage 150. The direction may be sent to a user or implemented through an automatic sample loading system, where system 100 is provided with such a sub-system.

Figure 6:
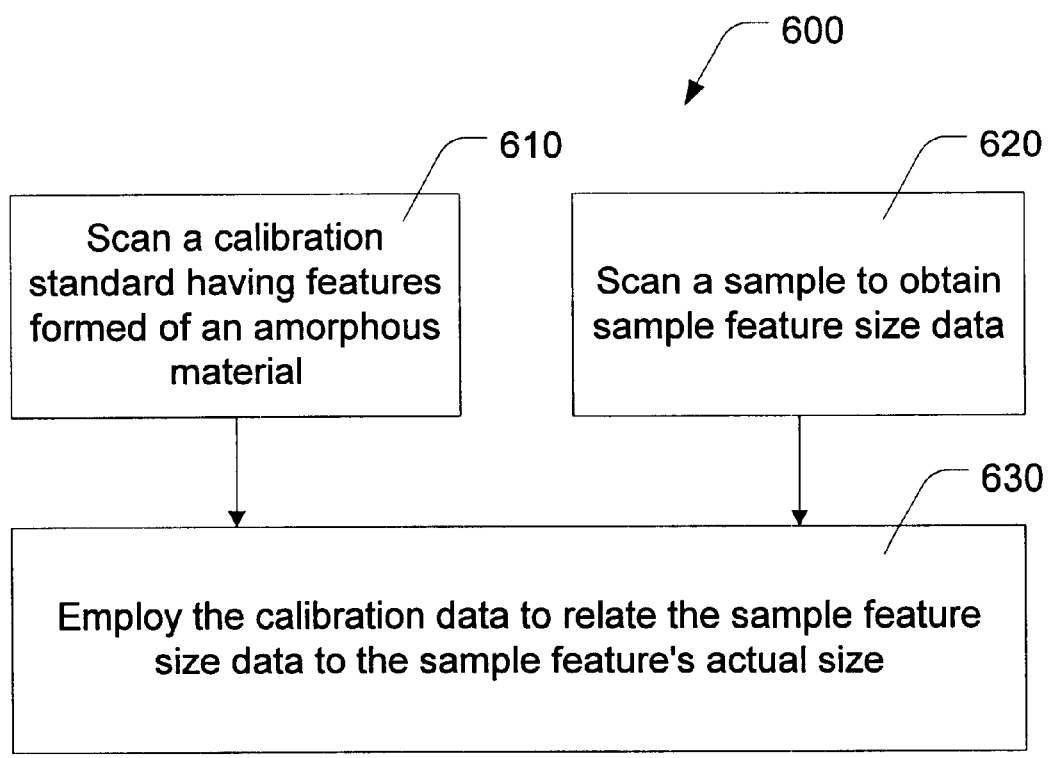
FIG. 6 is a flow diagram of a process according to a further aspect of the present invention.

FIG. 6 is a flow diagram of a process 600 of calibrating a scanning electron microscope according to one aspect of the present invention. In step 610, a calibration standard having features formed of a material including amorphous silicon is scanned to obtain calibration data related to the scanning electron microscope. In step 620, which may take place before or after step 610, a sample is scanned to obtain sample feature size data. The feature size data may be, for example, data relating to the size of a topographic feature, such as the width of a raised line or the width of a trench.

The data could also relate to a non-topographic feature, such as the width of a conductive region. In step 630, the calibration data and a known dimension of the calibration standard are used to relate the measured sample feature size data to the sample feature's actual size.

There are several options for carrying out step 630. In the simplest case, a feature that gives a measured size the same as that of the calibration standard is determined to have the same size as the calibration standard. Generally, however, the size measured for the sample is not the same as the size measured for the calibration standard. Therefore, an interpolation or extrapolation takes place. For example, the calibration data may be used to compute a proportionality factor, a, between measured values $V_M$ and actual values $V_A$, such that:

$$V_A = aV_M$$

Alternatively, the calibration may be used to compute an offset factor, b, such that:

$$V_A = V_M + b$$

Or, using two or more calibration measurements, a two factor linear relationship may be developed:

$$V_A = aV_M + b$$

Other relationships, including relationships with greater numbers of parameters, may also be used. The relationship may take into account, for example, variations in the calibration measurement that depend on the positioning of the measured feature in the scamming electron microscope. Rather than expressing the calibration relationship as a function, the calibration data may be stored in a table, for example, and measurements looked up against the table, interpolating where measurements fall between table entries.

The application of calibration data to interpretation of feature size measurements may take the form of a model, such as a model of electron beam dimensions (diameter, major and minor elliptical axis, etc.). In this regard, the calibration may be broken down into several elements. For example, one calibration may be used to relate measured relative movement of the electron beam and sample to actual relative movement, while another calibration may be used to characterize the electron beam cross-sectional shape and correct feature size measurements for beam shape effects. The calibration may be applied by adjusting the SEM system or the calibration may be applied in processing data from the SEM system.

Although the invention has been shown and described with respect to a certain preferred embodiment or embodiments, it is obvious that equivalent alterations and modifications will occur to others skilled in the art upon reading and understanding this specification and the annexed drawings. In particular regard to the various functions performed by the above described components (systems, devices, etc.), the terms used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description or the claims, such term is intended to be inclusive in a manner similar to the term "comprising."

What is claimed is:

1. A calibration standard for an SEM system, comprising:

a silicon wafer; and a patterned coating comprising amorphous silicon, the patterned coating having an $R_{tm}$ of about 5 Å or less;

wherein the patterned coating is over the silicon wafer and the patterned coating is in electrical communication with the silicon wafer to permit dissipation of electrostatic charges from the patterned coating to the silicon wafer.

2. The calibration standard of claim 1, wherein the patterned coating comprises periodic features with a pitch less than about 1 micron.

3. The calibration standard of claim 1, wherein the patterned coating consists essentially of amorphous silicon.

4. The calibration standard of claim 1, further comprising:

an intermediate coating over the silicon wafer and at least partially under the patterned coating;

wherein the intermediate coating facilitates binding the patterned coating to the silicon wafer.

5. The calibration standard of claim 4, wherein the intermediate coating is an insulating material.

6. The calibration standard of claim 5, wherein the intermediate coating comprises silicon dioxide.

7. The calibration standard of claim 5, wherein the patterned coating comprises patterned lines along the length of which the patterned coating contacts the intermediate coating and electrically communicates with the silicon wafer.

8. The calibration standard of claim 6, wherein:

the intermediate coating comprises trenches formed through the intermediate coating; and the patterned lines of the patterned coating are formed over the trenches.

9. A calibration standard for an SEM system, comprising:

a silicon wafer;

a conductive layer over the silicon wafer; and a patterned coating comprising amorphous silicon, the patterned coating having an $R_{tm}$ of about 5 Å or less;

wherein the patterned coating is over the conductive layer and the patterned coating is in electrical communication with the conductive layer, and the conductive layer is in electrical communication with the silicon wafer to permit dissipation of electrostatic charges from the patterned coating to the silicon wafer.

10. The calibration standard of claim 9, wherein the conductive layer comprises at least one selected from the group consisting of gold, tungsten, aluminum, silver, and copper.

11. A method of calibrating an SEM system, comprising:
obtaining a calibration measurement by employing the SEM system to measure a dimension of a feature of a calibration standard comprising a patterned coating comprising amorphous silicon over a silicon wafer, the patterned coating having an $R_{tm}$ of about 5 Å or less, wherein the patterned coating is in electrical communication with the silicon wafer; and
using the calibration measurement to calibrate the SEM system.

12. The method of claim 11, wherein using the calibration measurement to calibrate the SEM comprises adjusting the SEM system based on the calibration measurement.

13. The method of claim 11, wherein using the calibration measurement to calibrate the SEM comprises:
obtaining a sample measurement by employing the SEM system in measuring a dimension of a sample; and
interpreting the sample measurement with the aide of the calibration measurement.

14. The method of claim 11, wherein the patterned coating comprises periodic features with a pitch less than about 1 micron.

15. The method of claim 11, wherein:
the calibration standard further comprises an intermediate coating over the silicon wafer and at least partially under the patterned coating; and
the intermediate coating binds the patterned coating to the semiconductor wafer.

16. The method of claim 15, wherein the intermediate coating is an insulating material.

17. The method of claim 16, wherein the intermediate coating comprises silicon dioxide.

18. The method of claim 17, wherein the patterned coating comprises patterned lines along the length of which the patterned coating both contacts the intermediate coating and electrically communicates with the semiconductor wafer.

19. An SEM system, comprising:
a scanning electron microscope; and
a calibration standard comprising a pattern coating comprising amorphous silicon over a silicon wafer, the patterned coating having an $R_{tm}$ of about 5 Å or less, wherein the patterned coating is in electrical communication with the silicon wafer;
wherein the SEM system employs the calibration standard in calibrating the scanning electron microscope.

20. The SEM system of claim 19, wherein the calibration standard further comprises an intermediate coating comprising silicon dioxide between the patterned amorphous silicon and the silicon wafer, the intermediate coating having trenches threthrough so that a portion of the patterned amorphous silicon contacts the silicon wafer.

21. The SEM system of claim 19, wherein the calibration standard further comprises a conductive layer comprising at least one selected from the group consisting of gold, tungsten, aluminum, silver, and copper between the patterned amorphous silicon and the silicon wafer.

22. A method of calibrating an SEM system, comprising:
obtaining a calibration measurement by employing the SEM system to measure a dimension of a feature of a calibration standard comprising a patterned coating comprising amorphous silicon over a conductive layer, the conductive layer over a silicon wafer, the patterned coating having an $R_{tm}$ of about 5 Å or less, wherein the patterned coating is in electrical communication with the silicon wafer; and
using the calibration measurement to calibrate the SEM system.

* * * * *